(12) United States Patent
Tao et al.

(10) Patent No.: US 10,109,724 B2
(45) Date of Patent: Oct. 23, 2018

(54) HETEROJUNCTION BIPOLAR TRANSISTOR UNIT CELL AND POWER STAGE FOR A POWER AMPLIFIER

(71) Applicant: QUALCOMM Incorporated, San Diego, CA (US)

(72) Inventors: Gengming Tao, San Diego, CA (US); Bin Yang, San Diego, CA (US); Xia Li, San Diego, CA (US); Miguel Miranda Corbalan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/614,471

(22) Filed: Jun. 5, 2017

(65) Prior Publication Data
US 2018/0240898 A1 Aug. 23, 2018

Related U.S. Application Data

(60) Provisional application No. 62/462,280, filed on Feb. 22, 2017.

(51) Int. Cl.
| | |
|---|---|
| *H01L 29/73* | (2006.01) |
| *H01L 29/737* | (2006.01) |
| *H01L 29/08* | (2006.01) |
| *H01L 29/10* | (2006.01) |
| *H01L 29/66* | (2006.01) |
| *H01L 29/06* | (2006.01) |

(52) U.S. Cl.
CPC ...... *H01L 29/7371* (2013.01); *H01L 29/0696* (2013.01); *H01L 29/0817* (2013.01); *H01L 29/1004* (2013.01); *H01L 29/66242* (2013.01)

(58) Field of Classification Search
CPC .................................................... H01L 33/06
See application file for complete search history.

(56) References Cited

U.S. PATENT DOCUMENTS

| | | | | |
|---|---|---|---|---|
| 5,561,306 | A  * | 10/1996 | Imamura | H01L 29/0817 |
| | | | | 257/197 |
| 7,067,858 | B2 | 6/2006 | Hase | |
| 8,120,147 | B1 | 2/2012 | Sugg | |
| 8,216,910 | B2 | 7/2012 | Chen et al. | |
| 8,735,256 | B1 * | 5/2014 | Sugg | H01L 29/0817 |
| | | | | 257/198 |
| 9,570,595 | B2 | 2/2017 | Wu et al. | |

(Continued)

FOREIGN PATENT DOCUMENTS

EP 1938384 A1 7/2008

OTHER PUBLICATIONS

International Search Report and Written Opinion—PCT/US2017/069027—ISA/EPO—dated Apr. 11, 2018.

*Primary Examiner* — Caridad Everhart
*Assistant Examiner* — Ankush Singal
(74) *Attorney, Agent, or Firm* — Seyfarth Shaw LLP

(57) ABSTRACT

A heterojunction bipolar transistor unit cell may include a compound semiconductor substrate. The heterojunction bipolar transistor unity may also include a base mesa on the compound semiconductor substrate. The base mesa may include a collector region on the compound semiconductor substrate and a base region on the collector region. The heterojunction bipolar transistor unity may further include a single emitter mesa on the base mesa.

17 Claims, 10 Drawing Sheets

(56) References Cited

U.S. PATENT DOCUMENTS

| | | | |
|---|---|---|---|
| 2005/0035370 A1 | 2/2005 | Chen | |
| 2005/0156194 A1* | 7/2005 | Ohbu | H01L 27/0605 257/197 |
| 2006/0138459 A1 | 6/2006 | Kurokawa et al. | |
| 2006/0223484 A1* | 10/2006 | Maeda | H03F 3/19 455/333 |
| 2008/0054305 A1* | 3/2008 | Chang | H01L 21/8252 257/197 |
| 2008/0203426 A1* | 8/2008 | Uemura | H01L 29/66318 257/190 |
| 2008/0296617 A1 | 12/2008 | Mishra et al. | |
| 2010/0308211 A1* | 12/2010 | Cho | H01L 27/14625 250/214 R |
| 2013/0126826 A1* | 5/2013 | Walter | H01L 33/06 257/13 |
| 2013/0285121 A1* | 10/2013 | Zampardi, Jr. | H01L 29/73 257/197 |
| 2014/0018126 A1* | 1/2014 | Asai | H03H 9/0542 455/550.1 |
| 2014/0050241 A1* | 2/2014 | Dallesasse | H01S 5/3401 372/45.01 |
| 2014/0110825 A1* | 4/2014 | Parthasarathy | H01L 29/6631 257/565 |
| 2014/0145647 A1* | 5/2014 | Walter | H01L 27/15 315/313 |
| 2014/0167115 A1 | 6/2014 | Obu et al. | |
| 2015/0035121 A1* | 2/2015 | Sasaki | H01L 29/66318 257/566 |
| 2016/0211332 A1 | 7/2016 | Hiyoshi et al. | |
| 2017/0005183 A1 | 1/2017 | Bhalla et al. | |
| 2017/0236925 A1* | 8/2017 | Zampardi | H01L 29/737 257/197 |
| 2017/0359030 A1* | 12/2017 | Obu | H01L 29/205 |

* cited by examiner

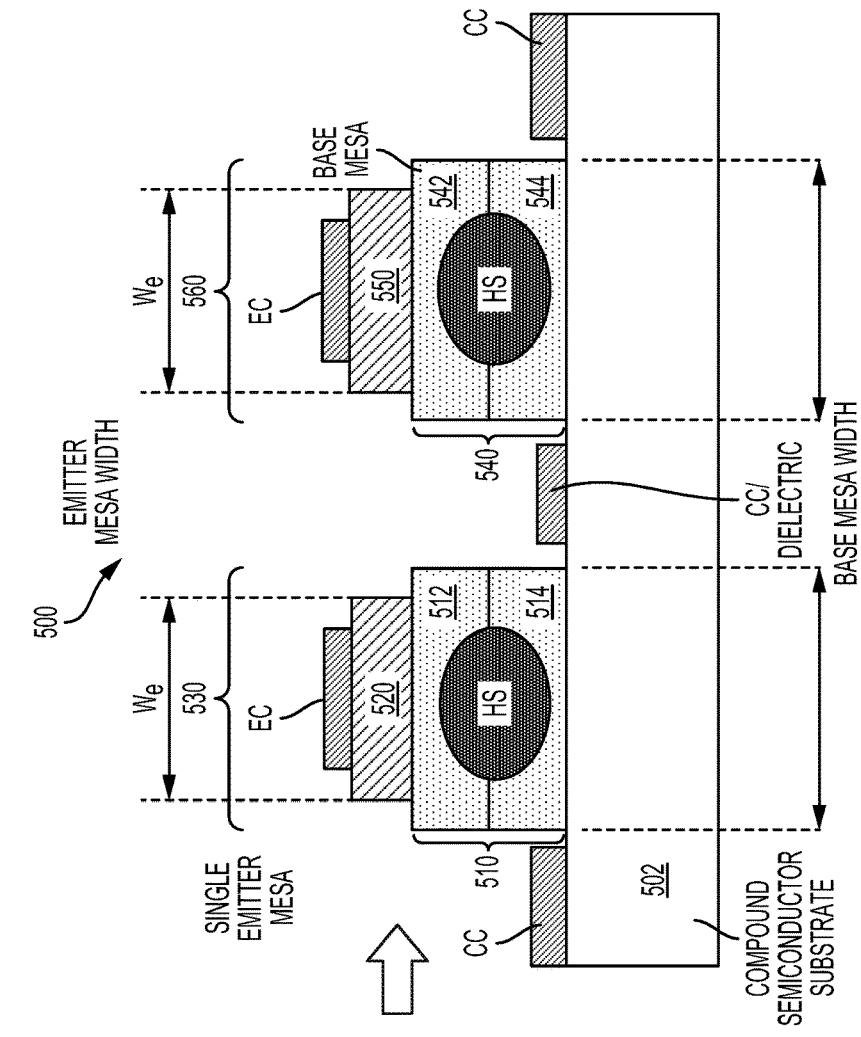
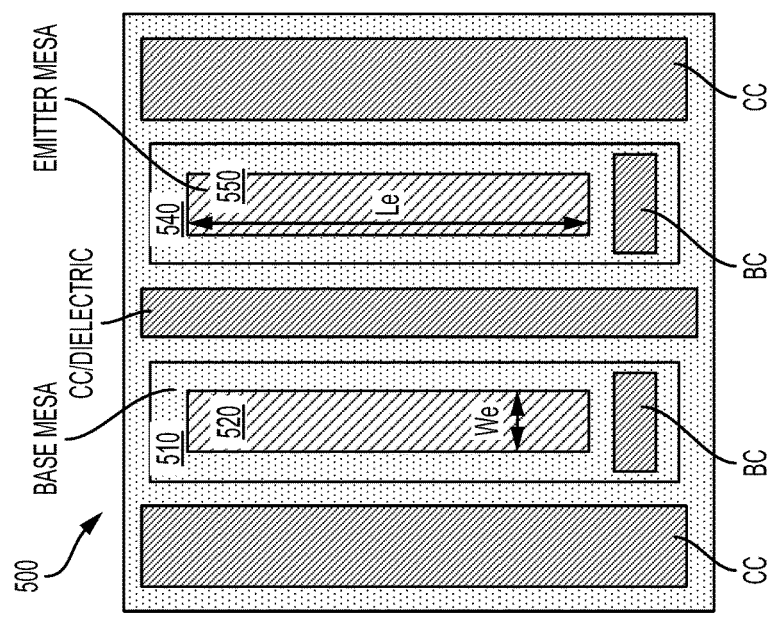
FIG. 5A
FIG. 5B

HETEROJUNCTION BIPOLAR TRANSISTOR UNIT CELL AND POWER STAGE FOR A POWER AMPLIFIER

CROSS-REFERENCE TO RELATED APPLICATION

The present application claims the benefit of U.S. Provisional Patent Application No. 62/462,280, filed on Feb. 22, 2017, and titled "NOVEL HETEROJUNCTION BIPOLAR TRANSISTOR STRUCTURE," the disclosure of which is expressly incorporated by reference herein in its entirety.

BACKGROUND

Field

The present disclosure relates generally to compound semiconductor devices, and more specifically, to a heterojunction bipolar transistor unit cell and power stage for a power amplifier.

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate a RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), and the like.

The implementation of carrier aggregation in mobile RF transceivers enables a wireless carrier to maximize available bandwidth by simultaneously using multiple frequencies for a single communication stream. While an increased amount of data is provided to the end user, successful implementation of carrier aggregation complicates thermal power specification of power amplifiers in the mobile RF transceiver. These thermal power specifications are further complicated because RF power amplifiers are generally not fabricated using a CMOS (complementary metal-oxide-semiconductor) process. Rather RF power amplifiers are often fabricated using column III and column V (III-V) or column II and column IV (II-VI) compound semiconductor materials that generally exhibit poor thermal conduction capabilities. Consequently, it is difficult to meet thermal power specifications in III-V or II-VI compound semiconductor devices, such as heterojunction bipolar transistor (HBT)-based power amplifiers.

BRIEF DESCRIPTION OF THE DRAWINGS

FIGS. 5A and 5B illustrate a cross-section view and a top view of a heterojunction bipolar transistor (HBT) having a single emitter structure with improved thermal stability according to aspects of the present disclosure.

SUMMARY

Figure 1:
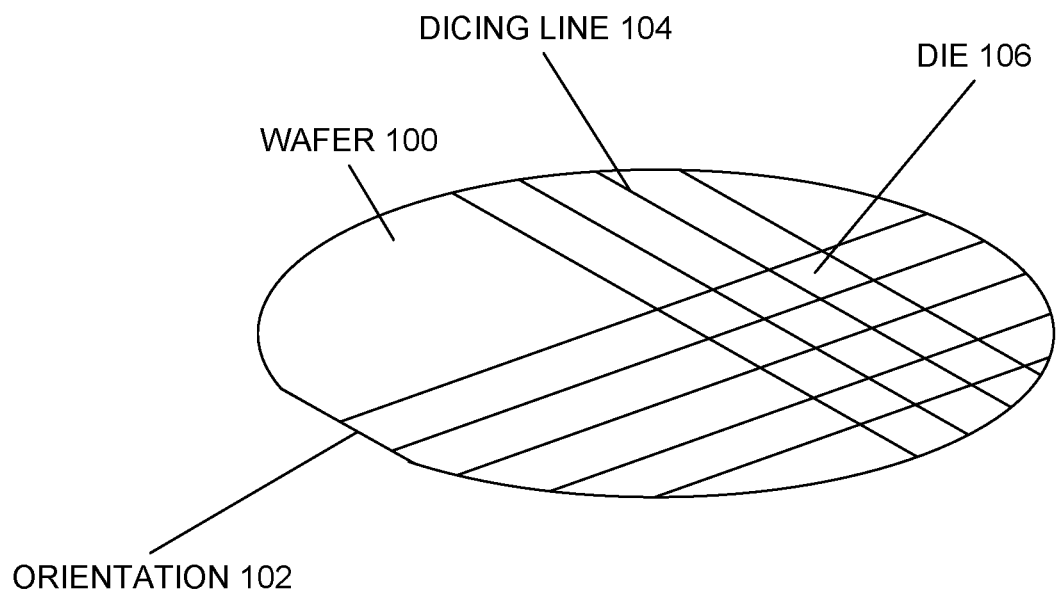
FIG. 1 illustrates a perspective view of a semiconductor wafer.

A heterojunction bipolar transistor unit cell may include a compound semiconductor substrate. The heterojunction bipolar transistor unity may also include a base mesa on the compound semiconductor substrate. The base mesa may include a collector region on the compound semiconductor substrate and a base region on the collector region. The heterojunction bipolar transistor unity may further include a single emitter mesa on the base mesa.

A heterojunction bipolar transistor unit cell may include a compound semiconductor substrate. The heterojunction bipolar transistor may also include a first base mesa on the compound semiconductor substrate. The heterojunction bipolar transistor may also include a first emitter mesa on the first base mesa. The heterojunction bipolar transistor may also include a second base mesa on the compound semiconductor substrate and spaced away from the first base mesa. The heterojunction bipolar transistor may further include a second emitter mesa on the second base mesa.

A power amplifier may include a plurality of heterojunction bipolar transistor unit cells. The heterojunction bipolar transistor unit cells may include each of the plurality of heterojunction bipolar transistor unit cells. The heterojunction bipolar transistor unit cells may also include a compound semiconductor substrate. The heterojunction bipolar transistor unit cells may further include a base mesa on the compound semiconductor substrate. The heterojunction bipolar transistor unity may further include a single emitter mesa on the base mesa.

A method of making a heterojunction bipolar transistor unit cell may include fabricating only a single emitter mesa. The method may also include fabricating a base mesa supporting the emitter mesa. The base mesa is arranged on a compound semiconductor substrate/

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described, the use of the term "and/or" is intended to represent an "inclusive OR", and the use of the term "or" is intended to represent an "exclusive OR".

The term "exemplary" used throughout this description means "serving as an example, instance, or illustration," and should not necessarily be construed as preferred or advantageous over other aspects of the present disclosure. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Fabrication of mobile radio frequency (RF) chip designs (e.g., mobile RF transceivers) becomes complex at deep sub-micron process nodes due to cost and power consumption considerations. A mobile RF transceiver may include a transmit section for data transmission and a receive section for data reception. For data transmission, the transmit section may modulate a RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

While an increased amount of data is provided to the end user, successful implementation of carrier aggregation complicates thermal specifications of power amplifiers in a mobile RF transceiver. For example, in a mobile RF transceiver, a communication signal is amplified and transmitted by a transmit section. The transmit section may include one or more circuits that amplify and transmit the communication signal. The amplifier circuits may include one or more amplifier stages that may have one or more driver stages and one or more power amplifier stages. Each of the amplifier stages may include one or more transistors configured in various ways to amplify the communication signal. The transistors configured to amplify the communication signal, however, are generally selected to operate at substantially higher frequencies, further complicating thermal power specifications.

These thermal power specifications are further complicated because RF power amplifiers are generally not fabricated using a CMOS (complementary metal-oxide-semiconductor) process. Because column III and column V (III-V) or column II and column IV (II-VI) compound semiconductor materials exhibit poor thermal conduction capabilities, it is difficult to meet thermal power specifications in III-V or II-VI compound semiconductor devices, such as heterojunction bipolar transistor (HBT)-based power amplifiers.

Bipolar transistors, which are also referred to as bipolar junction transistors (BJTs), are a type of transistor that uses both hole and electron carriers. Bipolar transistors are fabricated in integrated circuits and are also used as individual components. Bipolar transistors are designed to amplify power. This basic function of bipolar transistors makes them a logical choice for implementing amplifiers and switches. As a result, bipolar transistors are widely used in electronic equipment, such as cellular phones, audio amplifiers, and radio transmitters.

A heterojunction bipolar transistor (HBT) is a type of bipolar transistor that uses different semiconductor materials for emitters and base regions of the device, which create a heterojunction. A heterojunction bipolar transistor may use a III-V compound semiconductor material, a II-VI compound semiconductor material, or other like compound semiconductor material. Column III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers.

A heterojunction bipolar transistor (HBT) integrated circuit (HBT chip) may include an HBT to provide a power amplifier. Unfortunately, 3G/4G HBT power amplifiers in mobile phones may suffer from thermal issues. In particular, a significant challenge in designing HBT-based power amplifiers is thermal stability, which may reduce a safe operating area size. As a result, heat dissipation is increasingly problematic for HBT-based power amplifiers. In fact, the compound semiconductor materials used by HBT-based power amplifiers may lead to localized thermal hot spots.

One configuration of an HBT-based power amplifier includes a base mesa supported by a compound semiconductor substrate (e.g., GaAs). The base mesa may support dual emitter mesas. As noted above, severe heat may be generated inside an HBT collector, for example, under an emitter/base region of an HBT-based power amplifier. In this configuration of the HBT-based power amplifier, severe heat is generated in the base mesa, under each of the dual emitter mesas supported by the base mesa. In particular, strong thermal coupling between the heat sources below each of the dual emitter mesas further increases a junction temperature of the HBT-based power amplifier.

Aspects of the present disclosure may solve this problem by fabricating an HBT unit cell for an HBT-based power amplifier by dividing the base mesa to form a single emitter structure that eliminates or at least reduces thermal coupling of the heat sources in the base mesa. In aspects of the present disclosure, the HBT unit cell may include a compound semiconductor substrate supporting a base mesa. In this configuration, the base mesa is divided to support a single emitter mesa on the base mesa, which may be referred to as a single emitter structure. Thermal heat dissipation in the single emitter structure may be improved by reducing thermal coupling of the heat sources in the base mesa.

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
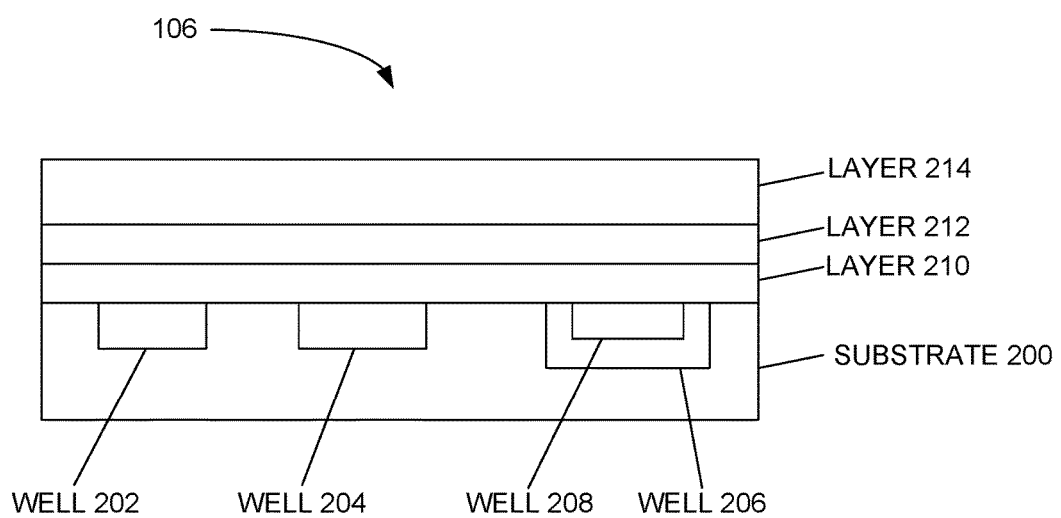
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200. Alternatively, the substrate may be a semi-insulating substrate, including compound semiconductor transistors.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT), a heterojunction bipolar transistor (HBT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods.

Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure. Aspects of the present disclosure may be directed to reducing heat in heterojunction bipolar transistors or other like compound semiconductor transistors.

A heterojunction bipolar transistor (HBT) is a type of bipolar transistor that uses different semiconductor materials for emitters and base regions of the device, which creates a heterojunction. A heterojunction bipolar transistor may use a III-V compound semiconductor material, a II-VI compound semiconductor material, or other like compound semiconductor material. III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers, for example, as shown in FIG. 3.

Figure 3:
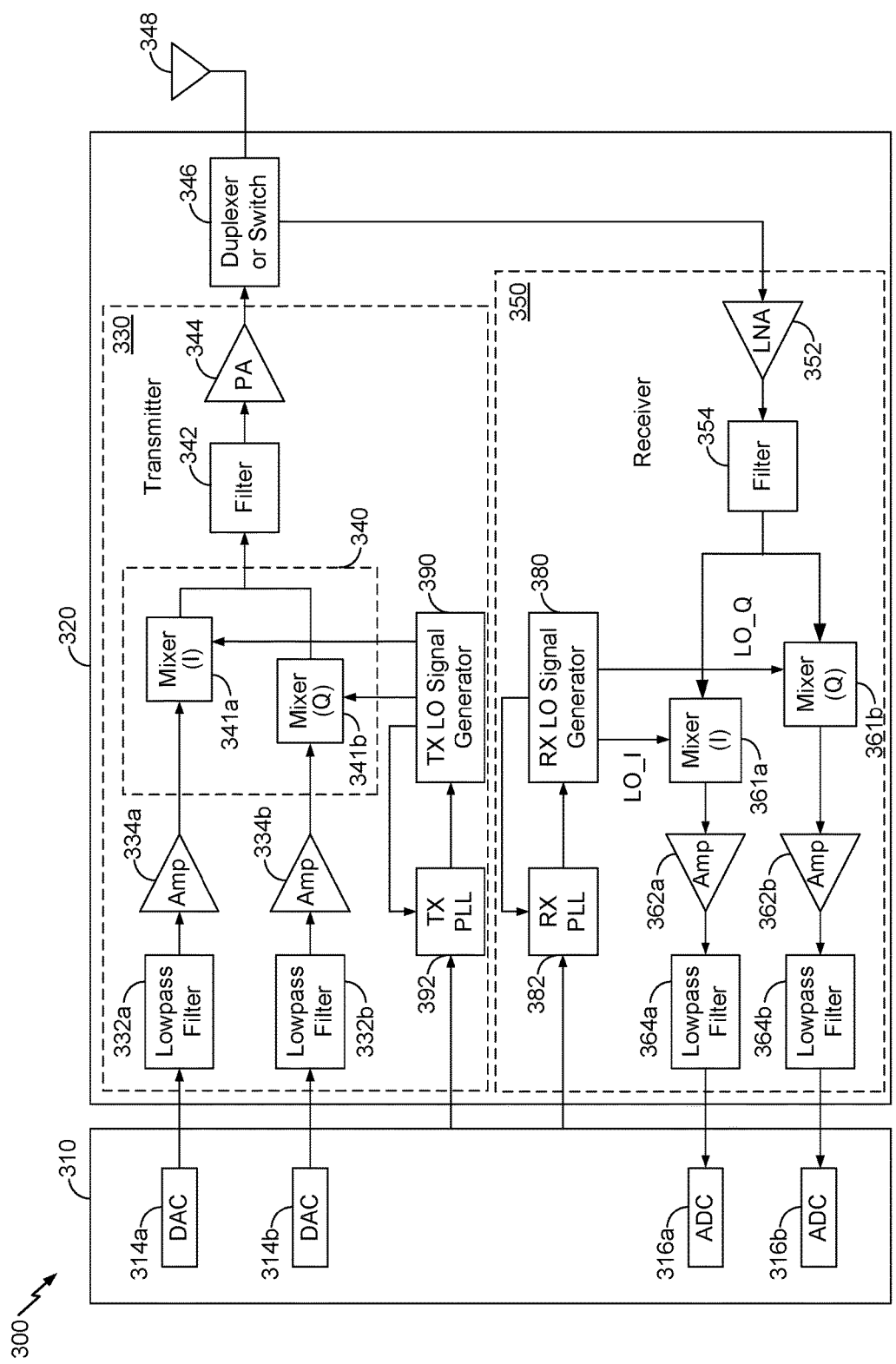
FIG. 3 shows a block diagram of an exemplary wireless device.

FIG. 3 shows a block diagram of an exemplary design of a wireless device 300. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, low pass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from low pass filters 332a and 332b, respectively, and provide in-phase (I) and quadrature (Q) baseband signals. Upconversion mixers 341a and 341b of an upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from the filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by low pass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 344 may include one or more stages having, for example, driver stages, power amplifier stages, or other components, that can be configured to amplify a communication signal on one or more frequencies, in one or more frequency bands, and at one or more power levels. The transistors configured to amplify the communication signal, however, are generally selected to operate at substantially higher frequencies, complicating thermal power specifications. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

Unfortunately, a significant challenge in designing HBT-based power amplifiers is thermal stability, which may reduce a safe operating area size. That is, heat dissipation is increasingly problematic in HBT-based power amplifiers. In particular, the compound semiconductor materials used by HBT-based power amplifiers may lead to localized thermal hot spots. As the localized thermal hot spots are embedded in the device, this may reduce the ability to cool the hot spots and achieve low junction temperatures. Conventional cooling solutions for achieving low junction temperatures include heat sinks, heat spreaders, and/or improved printed circuit boards. Unfortunately, conventional techniques of simply increasing the size of the heat spreader and/or the heat sink are impractical in small form factor devices (e.g., smartphones).

One configuration of an HBT-based power amplifier includes a base mesa supporting dual emitter mesas. Unfortunately, in this configuration of the HBT-based power amplifier, severe heat is generated in the base mesa, under each of the dual emitter mesas supported by the base mesa. Strong thermal coupling between the heat sources below each of the dual emitter mesas further increases a junction temperature of the HBT-based power amplifier.

Figure 8:
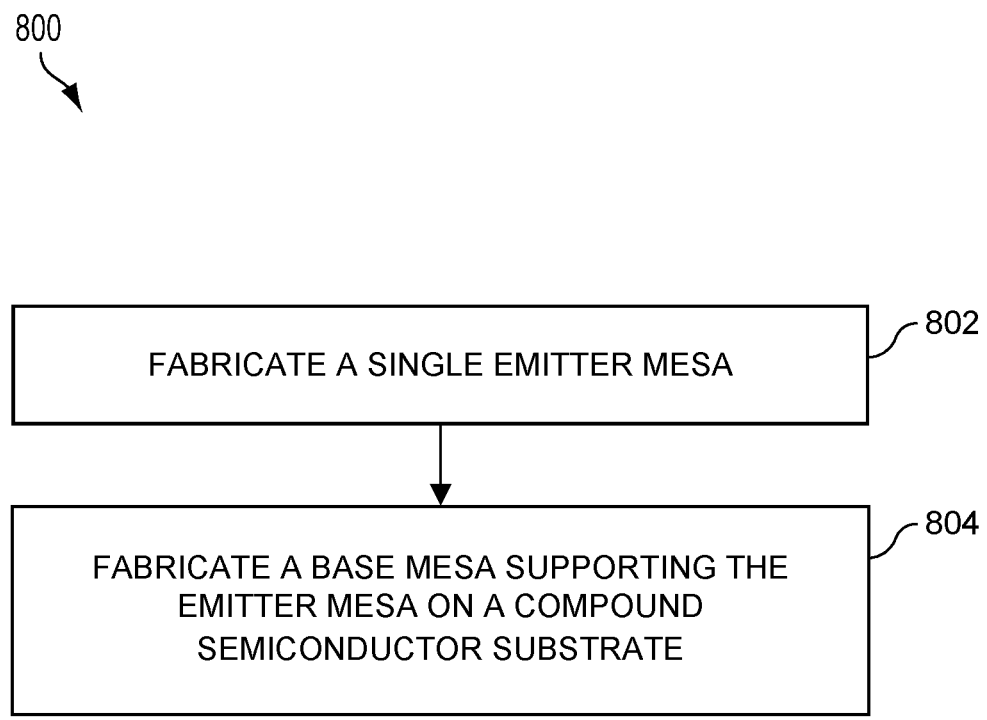
FIG. 8 illustrates a method of making a heterojunction bipolar transistor (HBT) unit cell, according to aspects of the present disclosure

Aspects of the present disclosure may solve this problem by fabricating an HBT-unit cell for an HBT-based power amplifier by dividing the base mesa to reduce thermal coupling of the heat sources in the base mesa. In aspects of the present disclosure, the HBT unit cell may include a compound semiconductor substrate supporting a base mesa. In this configuration, the base mesa is divided to support a single emitter mesa on the base mesa, which may be referred to as a single emitter structure. Thermal heat dissipation may be improved by reducing thermal coupling of the heat sources in the base mesa when a single emitter structure is used, for example, as described with respect to FIGS. 5A and 5B. A method of making a heterojunction bipolar transistor unit cell, for example, is shown in FIG. 8.

Figures 4A, 4B:
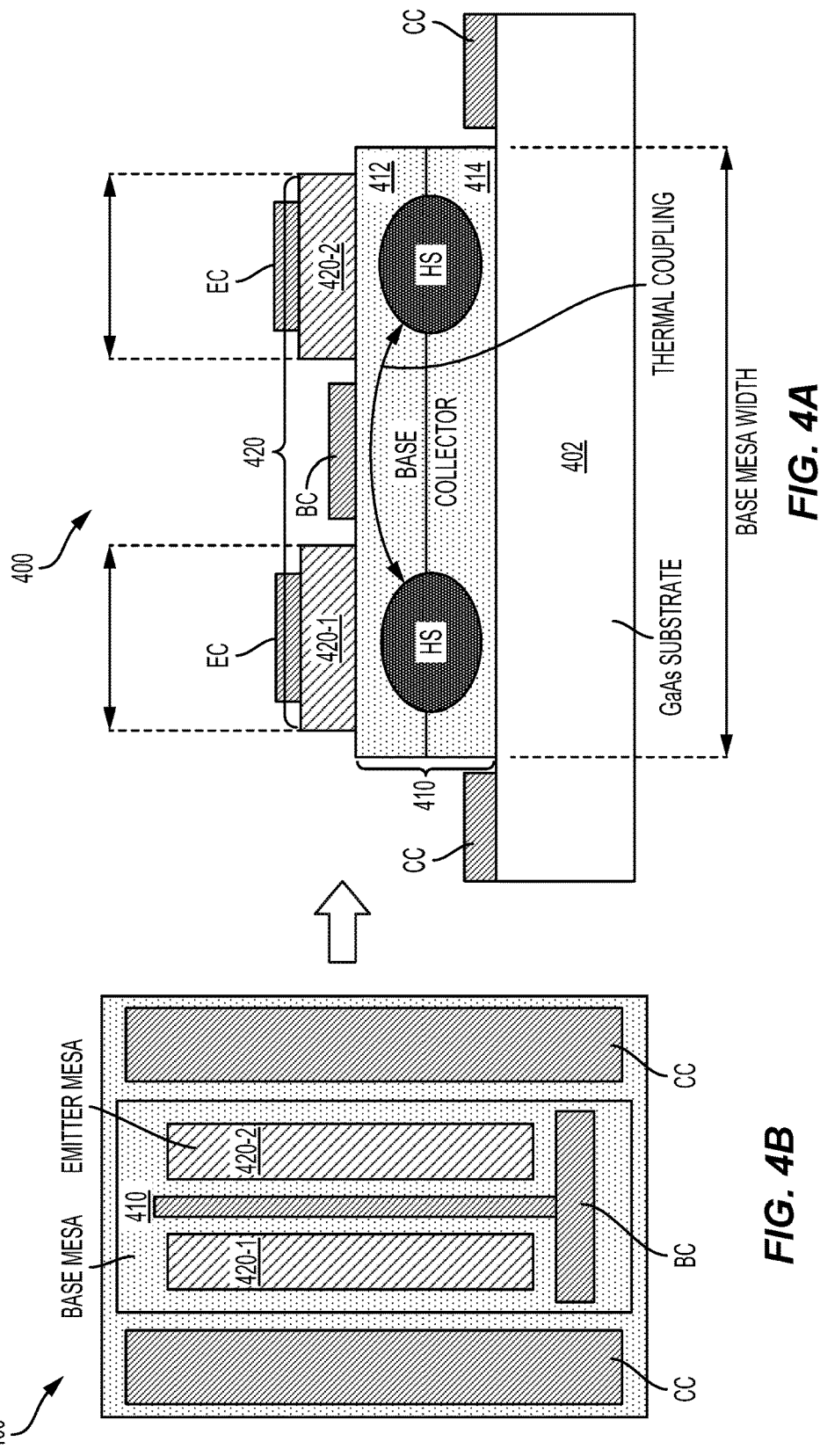
FIGS. 4A and 4B illustrate a top view and a cross-section view of a heterojunction bipolar transistor (HBT) having a dual emitter structure that suffers from poor heat dissipation.

FIGS. 4A and 4B illustrate a cross-section view and a top view of a heterojunction bipolar transistor having a dual emitter structure that suffers from poor thermal stability, which may be due to an increased junction temperature caused by thermal coupling.

FIG. 4A shows a heterojunction bipolar transistor (HBT) device 400 that suffers from an increased junction temperature caused by thermal coupling of heat sources HS. The HBT device 400 includes a dual emitter structure 420 supported by a base mesa 410. The dual emitter structure 420 includes a first emitter mesa 420-1 having an emitter contact EC. In addition, the dual emitter structure 420 includes a second emitter mesa 420-2, also having an emitter contact EC. A base contact BC is between the first emitter mesa 420-1 and the second emitter mesa 420-2. Heat sources HS are shown below the first emitter mesa 420-1 and the second emitter mesa 420-2 in the base mesa 410.

As shown in FIG. 4B, the base contact BC is T-shaped, including a portion along and between the first emitter mesa 420-1 and the second emitter mesa 420-2, between the collector contacts CC. The T-shaped base contact BC also includes a second portion that runs along a length of the base mesa 410, between the first emitter mesa 420-1 and the second emitter mesa 420-2. Although described as T-shaped, it should be recognized that the base contacts BC may be arranged in other shapes according to aspects of the present disclosure.

Referring again to FIG. 4A, the base mesa 410 may include a base 412 supported by a collector 414. The base mesa 410 is supported by a compound semiconductor substrate 402 (e.g., gallium arsenide (GaAs)). Collector contacts CC of the collector 414 may be on the compound semiconductor substrate 402. Alternatively, the collector contacts CC may be on a sub-collector (not shown) supported by the compound semiconductor substrate 402. A width of the base mesa and a width of the first emitter mesa 420-1 and the second emitter mesa 420-2 are also shown. Unfortunately, a ratio of a base mesa area ($A_{BC}$) to an emitter mesa area $A_E$ ($A_{BC}/A_E$) is greater than a predetermined value (e.g., 2.45). In this scenario, the base mesa area to emitter mesa area ratio is too large to reduce base/collector capacitance and improve gain and efficiency of the HBT device 400.

In operation, heat generated by heat sources HS of the HBT device 400 accumulates below the first emitter mesa 420-1 and the second emitter mesa 420-2 of the HBT device 400. In particular, heat accumulates in junctions of the base mesa 410 (e.g., a junction between the base 412 and the collector 414), below the first emitter mesa 420-1 and the second emitter mesa 420-2. Unfortunately, thermal coupling between the heat sources HS of the HBT device 400 may further increase the junction temperatures in the base mesa 410. Furthermore, the compound semiconductor materials of the base mesa 410 and the compound semiconductor substrate 402 may also trap the heat.

Representatively, thermal coupling of the heat sources HS is increased by the compound semiconductor materials of the base mesa 410 and the compound semiconductor substrate 402. That is, the poor thermal conductivity of the compound semiconductor materials of the base mesa 410 and the compound semiconductor substrate 402 inhibit the heat from dissipating away from the region of the base mesa 410, below the first emitter mesa 420-1 and the second emitter mesa 420-2. As a result, thermal coupling of the heat sources HS is increased due to the poor thermal conductivity of the compound semiconductor materials of the HBT device 400. This results in overheating and possible damage to the HBT device 400, which substantially degrades thermal stability. As demand for higher output power density increases, the thermal issues relating to HBTs will increase as well.

Aspects of the present disclosure may solve this problem by fabricating an HBT-unit cell for an HBT-based power amplifier by dividing the base mesa to reduce thermal coupling of the heat sources in the base mesa. In aspects of the present disclosure, the HBT unit cell may include a compound semiconductor substrate supporting a base mesa. In this configuration, the base mesa is divided to support a single emitter mesa on the base mesa, which may be referred to as a single emitter structure. Thermal heat dissipation may be improved by reducing thermal coupling of the heat sources in the base mesa when a single emitter structure is used, for example, as described in FIGS. 5A and 5B.

FIGS. 5A and 5B illustrate a cross-section view and a top view of a heterojunction bipolar transistor having a single emitter structure according to aspects of the present disclosure. The single emitter structure improves thermal stability by reducing a junction temperature to protect against device breakdown. More specifically, aspects of the present disclosure may relate to unit cell layouts of a heterojunction bipolar transistor and an associated power amplifier (PA), which significantly reduce capacitance and thermal effects, while improving power gain and efficiency. The single emitter structure of FIGS. 5A and 5B may yield a twenty degree Kelvin (20° K) reduction of the collector temperature over the dual emitter structure of FIGS. 4A and 4B.

FIG. 5A shows a heterojunction bipolar transistor (HBT) device 500 that includes a single emitter structure with improved thermal stability according to aspects of the present disclosure. The HBT device 500 includes dual, single emitter structures supported by dual base mesas. In this arrangement, a first emitter structure 530 includes a first emitter mesa 520 having an emitter contact EC and supported by a first base mesa 510. The first base mesa 510 includes a first base region 512 supported by a first collector region 514. In addition, the dual, single emitter structure includes a second emitter structure 560 having a second emitter mesa 550, also having an emitter contact EC, and supported by a second base mesa 540. The second emitter mesa 550 also includes a second base region 542 supported by a second collector region 544. An optional collector contact CC and/or a dielectric layer (not shown) is arranged on the compound semiconductor substrate, between the first base mesa 510 and the second base mesa 540.

As shown in FIG. 5B, the base contacts BC are rectangular-shaped, having a single portion along a width We of the first emitter mesa 520, between the collector contacts CC. By contrast, the T-shaped base contact BC of FIG. 4B includes a second portion that runs along a length of the base mesa 410, between the first emitter mesa 420-1 and the second emitter mesa 420-2. The base contact BC shown in FIG. 5B may substantially reduce base/collector capacitance by eliminating the second portion of the T-shaped base contact BC of FIG. 4B. In addition, the base contact BC is further reduced in this arrangement because the base contacts BC only extend along the width We of the first emitter mesa 520 and the second emitter mesa 550. Although described as rectangular-shaped, it should be recognized that the base contacts BC may be any other shapes according to aspects of the present disclosure.

Referring again to FIG. 5A, the first emitter structure 530 and the second emitter structure 560 are supported by a compound semiconductor substrate 502 (e.g., gallium arsenide (GaAs)). Collector contacts CC of the first collector region 514 and second collector region 544 may be provided on the compound semiconductor substrate 502. Alternatively, the collector contacts CC may be provided on a sub-collector (not shown) supported by the compound semiconductor substrate 502. A width We of the first emitter mesa 520 and the second emitter mesa 550 and a width of the first base mesa 510 and the second base mesa 540 are also shown. In this arrangement, a ratio of a base mesa area ($A_{BC}$) to an emitter area $A_E$ ($A_{BC}/A_E$) is less than a predetermined value (e.g., 2.00). In this scenario, the base mesa area to emitter area ratio is reduced, which also decreases a base/collector capacitance and improves gain and efficiency of the HBT device 500.

In operation, heat generated by heat sources HS of the HBT device 500 accumulates below the first emitter mesa 520 and the second emitter mesa 550 of the HBT device 500. In particular, heat accumulates in junctions of the first base mesa 510 (e.g., a junction between the first base region 512 and the first collector region 514) and the second base mesa 540 (e.g., a junction between the second base region 542 and the second collector region 544), below the first emitter mesa 520 and the second emitter mesa 550. Fortunately, thermal coupling between the heat sources HS of the HBT device 500 is reduced by dividing the base mesa area into dual, single emitter structures. The HBT device 500 includes dual, single emitter structures (e.g., the first emitter structure 530 and the second emitter structure 560) supported by dual base mesas (e.g., the first base mesa 510 and the second base mesa 540).

The dual, single emitter structures compensate for poor thermal conductivity of the compound semiconductor materials of the first base mesa 510 and second base mesa 540 as well as the compound semiconductor substrate 502, which tend to trap the heat. That is, the poor thermal conductivity of the compound semiconductor materials of the first base mesa 510, the second base mesa 540, and the compound semiconductor substrate 502 generally inhibit the heat from dissipating away from the region below the first emitter mesa 520 and the second emitter mesa 550. As a result, avoiding thermal coupling of the heat sources HS is important due to the poor thermal conductivity of the compound semiconductor materials of the HBT device 500. This prevents overheating and potential damage to the HBT device 500, which substantially improves thermal stability.

Figure 6:
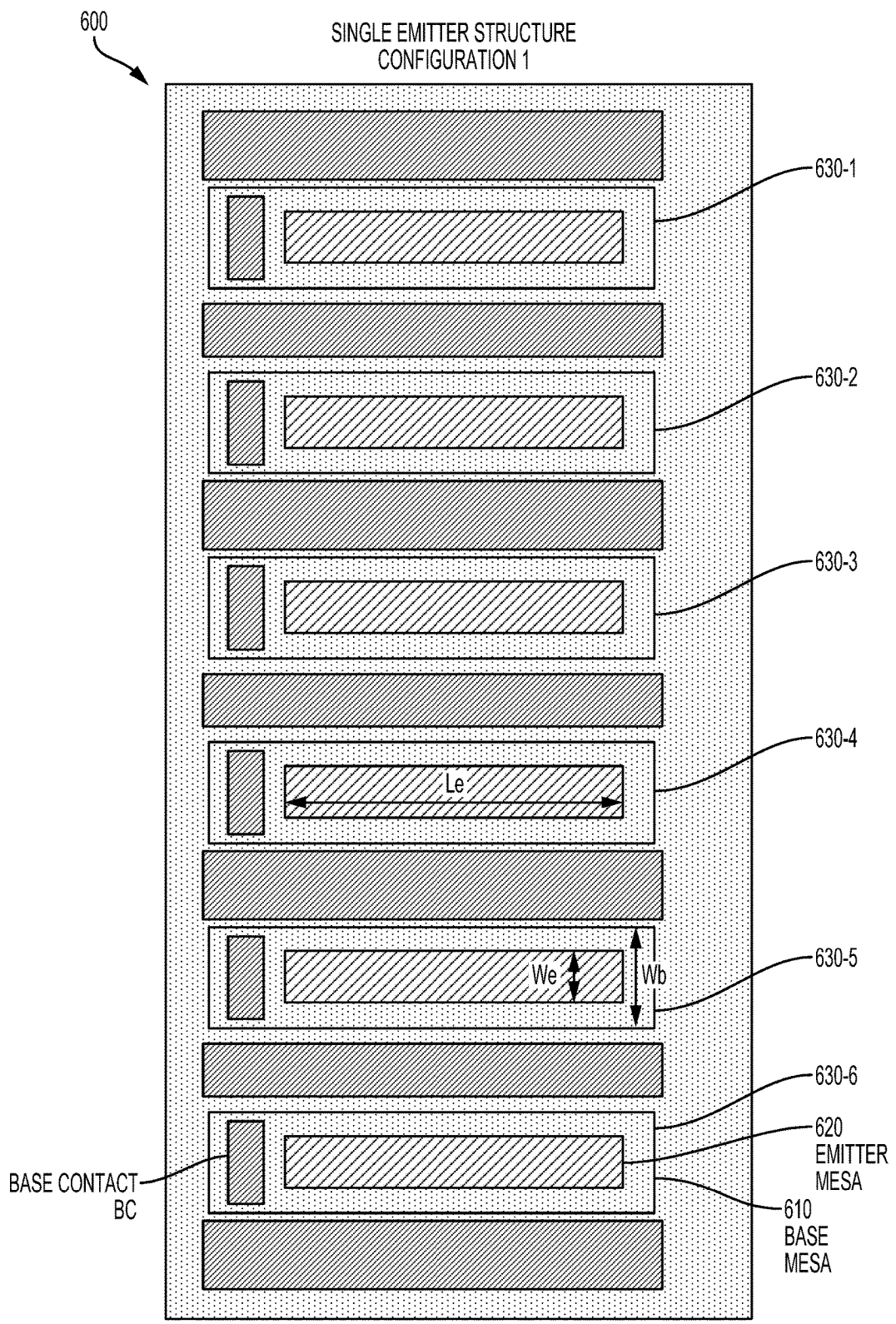
FIG. 6 shows heterojunction bipolar transistor unit cells of a heterojunction bipolar transistor (HBT) power amplifier, in accordance with aspects of the present disclosure.

As demand for higher output power density increases, reducing thermal issues of HBTs enables support for future operating frequencies. In one configuration, a width We of the first emitter mesa 520 and the second emitter mesa 550 may be less than a length Le of the emitter mesa, as shown in the configuration of FIG. 6. In another configuration, a width We of the first emitter mesa 520 and the second emitter mesa 550 may be equal to or greater than a length Le of the emitter mesas, as shown in the configuration of FIG. 7.

FIG. 6 shows heterojunction bipolar transistor unit cells of an HBT power amplifier 600, in accordance with aspects of the present disclosure. The HBT power amplifier 600 includes HBT unit cells 630 (630-1, 630-2, . . . , 630-6), each having an emitter mesa 620, supported by a base mesa 610. A length of the emitter mesa 620 and a length of the base mesa 610 are extended to provide rectangular shaped base and emitter mesas. In addition, a width We of the emitter mesa 620 is slightly less than a width Wb of the base mesa 610. As a result, an area ratio between the base mesa 610 and the emitter mesa 620 is further reduced, while eliminating thermo-coupling.

Figure 7:
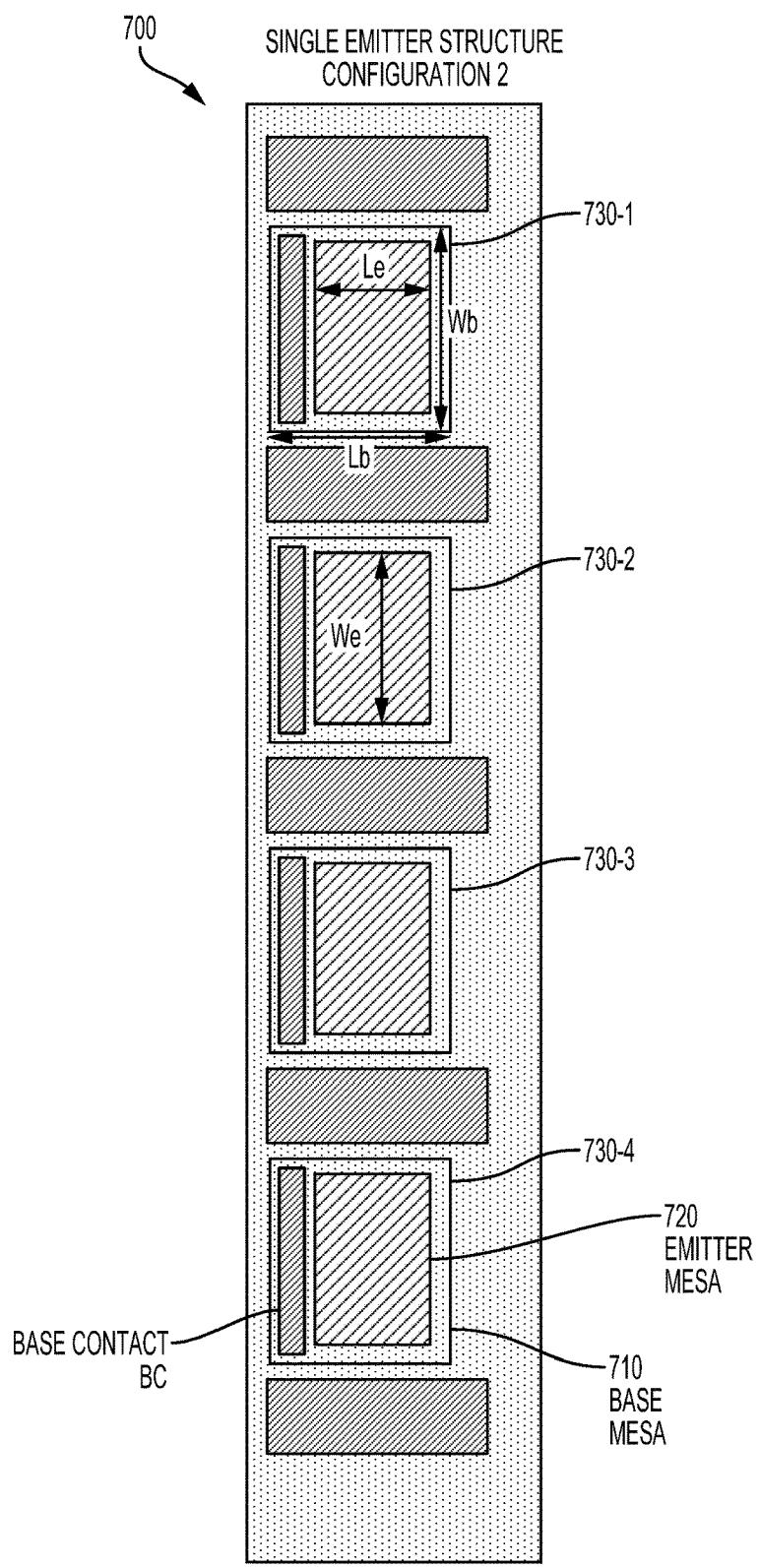
FIG. 7 shows heterojunction bipolar transistor unit cells of a heterojunction bipolar transistor (HBT) power amplifier, in accordance with further aspects of the present disclosure.

FIG. 7 shows heterojunction bipolar transistor unit cells of an HBT power amplifier 700, in accordance with aspects of the present disclosure. The HBT power amplifier 700 includes HBT unit cells 730 (730-1, 730-2, 730-3, 730-4), each having an emitter mesa 720, supported by a base mesa 710. A length Le of the emitter mesa 720 and a length Lb of the base mesa 710 are reduced. In addition, a width We of the emitter mesa 720 and a width Wb of the base mesa 710 are extended to provide rectangular shaped base and emitter mesas. In this arrangement, the width We of the emitter mesa 720 is greater than the length Le of the emitter mesa 720. This arrangement beneficially reduces base contact BC resistance by increasing a size of the base contact BC. In addition, the width We of the emitter mesa 720 is slightly less than a width Wb of the base mesa 710. As a result, an area ratio between the base mesa 710 (e.g., a first base mesa area) and the emitter mesa 720 (e.g., a first emitter mesa area) is further reduced relative to the configuration of FIG. 6, while eliminating thermo-coupling.

FIG. 8 illustrates a method 800 of making a heterojunction bipolar transistor unit cell, according to aspects of the present disclosure. In block 802, a single emitter mesa is fabricated. For example, as shown in FIG. 5A, a first emitter mesa 520 is fabricated. In block 804, a base mesa is fabricated below the emitter mesa on a compound semiconductor substrate. For example, as shown in FIG. 5A, a first base mesa 510 is fabricated below the first emitter mesa 520, and a second base mesa 540 is fabricated below the second emitter mesa 550 on the compound semiconductor substrate 502 to provide a first emitter structure 530 and a second emitter structure 560. According to an aspect, the first emitter mesa 520 is fabricated before the first base mesa 510 because the emitter epitaxial layer is on top of the base epitaxial layer, and the process goes from top down.

The method includes depositing a conductive contact material on the base mesa proximate only one side of the single emitter mesa. For example, as shown in FIG. 5B, a first base contact CC is proximate only one side of the first emitter mesa 520. In addition, a second base contact CC is proximate only one side of the second emitter mesa. In this arrangement, an isolation layer is deposited on the compound semiconductor substrate 502, between the first base mesa 510 and the second base mesa 540. Optionally, a collector contact CC and/or a dielectric layer may be deposited on the compound semiconductor substrate, between the first base mesa 510 and the second base mesa 540.

One configuration of an HBT-based power amplifier includes a base mesa that supports dual emitter mesas, in which the base mesa is supported by a compound semiconductor substrate. Unfortunately, severe heat may be generated inside an HBT collector, for example, under an emitter/base region of an HBT-based power amplifier. In this configuration of the HBT-based power amplifier, severe heat is generated in the base mesa, under each of the dual emitter mesas supported by the base mesa. In particular, strong thermal coupling between the heat sources in the base mesa, below each of the dual emitter mesas, further increases a junction temperature of the HBT-based power amplifier.

Aspects of the present disclosure may solve this problem by fabricating an HBT unit cell for an HBT-based power amplifier by dividing the base mesa. Dividing the base mesa enables formation of single emitter structures that eliminate or at least reduce thermal coupling of the heat sources in the base mesa. In aspects of the present disclosure, an HBT unit cell may include a compound semiconductor substrate supporting a base mesa. In this configuration, the base mesa is divided to support a single emitter mesa on the base mesa, which may be referred to as a single emitter structure. Thermal heat dissipation in the single emitter structure may be improved by reducing thermal coupling of the heat sources in the base mesa.

As described, compound semiconductor materials may include, but are not limited to, gallium arsenide (GaAs), indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), and/or indium gallium arsenide:nitride (InGaAs:N).

According to the present disclosure, a heterojunction bipolar transistor unit cell includes means for supporting the heterojunction bipolar transistor unit cell. For example, the means for supporting may be the compound semiconductor substrate, as shown in FIG. 5A. In another aspect, the aforementioned means may be any structure or any device configured to perform the functions recited by the aforementioned means.

Figure 9:
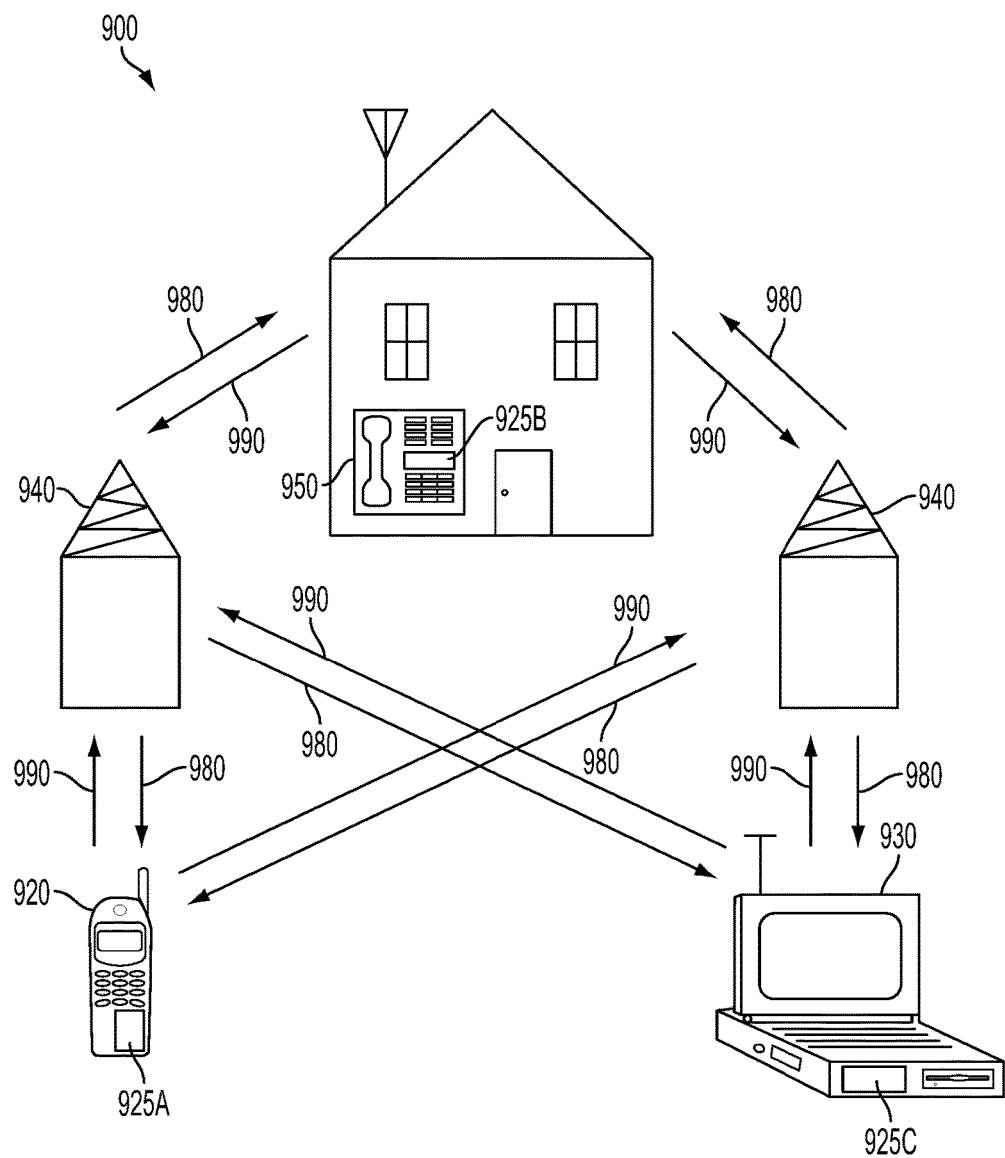
FIG. 9 is a block diagram showing an exemplary wireless communication system in which an aspect of the disclosure may be advantageously employed.

FIG. 9 is a block diagram showing an exemplary wireless communication system 900 in which an aspect of the disclosure may be advantageously employed. For purposes of illustration, FIG. 9 shows three of the remote units 920, 930, and 950 and two of the base stations 940. It will be recognized that wireless communication systems may have many more remote units and base stations. Remote units 920, 930, and 950 include IC devices 925A, 925C, and 925B that include the heterojunction transistor unit cell. It will be recognized that other devices may also include the disclosed integrated heterojunction transistor unit cell, such as the base stations, switching devices, and network equipment. FIG. 9 shows forward link signals 980 from one of the base stations 940 to the remote units 920, 930, and 950 and reverse link signals 990 from the remote units 920, 930, and 950 to base stations 940.

In FIG. 9, one of the remote units 920 is shown as a mobile telephone, one of the remote units 930 is shown as a portable computer, and remote unit 950 is shown as a fixed location remote unit in a wireless local loop system. For example, the remote units may be a mobile phone, a hand-held personal communication systems (PCS) unit, a portable data unit such as a personal digital assistant (PDA), a GPS enabled device, a navigation device, a set top box, a music player, a video player, a communications device, an entertainment unit, a fixed location data unit such as a meter reading equipment, or other devices that store or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed heterojunction transistor unit cell.

Figure 10:
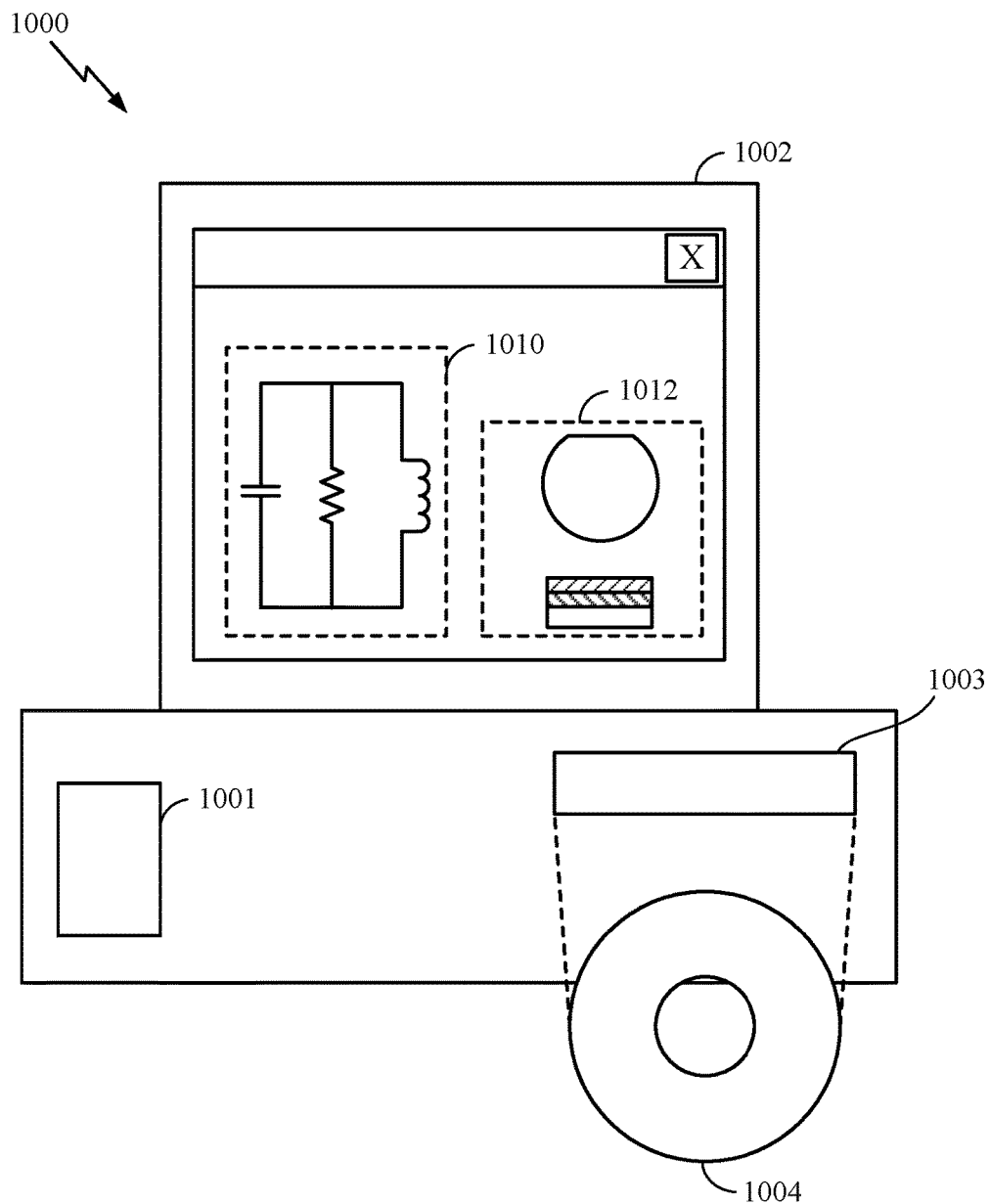
FIG. 10 is a block diagram illustrating a design workstation used for circuit, layout, and logic design.

FIG. 10 is a block diagram illustrating a design workstation used for circuit, layout, and logic design of the heterojunction transistor unit cell. A design workstation 1000 includes a hard disk 1001 containing operating system software, support files, and design software such as Cadence or OrCAD. The design workstation 1000 also includes a display 1002 to facilitate design of a circuit 1010 or the heterojunction transistor unit cell 1012. A storage medium 1004 is provided for tangibly storing the design of the circuit 1010 or the heterojunction transistor unit cell 1012. The design of the circuit 1010 or the heterojunction transistor unit cell 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the heterojunction transistor unit cell 1012 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described but is to be accorded the widest scope consistent with the principles and novel features disclosed.

What is claimed is:

1. A heterojunction bipolar transistor unit cell, comprising:
    a compound semiconductor substrate;
    a base mesa on the compound semiconductor substrate, the base mesa comprising a collector region on the compound semiconductor substrate and a base region on the collector region; and
    a single emitter mesa on the base mesa, in which a width of the single emitter mesa is greater than or equal to a length of the single emitter mesa.

2. The heterojunction bipolar transistor unit cell of claim 1, in which a ratio of a base mesa area to an emitter mesa area is less than two.

3. The heterojunction bipolar transistor unit cell of claim 1, further comprising a base contact proximate only one side of the single emitter mesa.

4. The heterojunction bipolar transistor unit cell of claim 1 in which the compound semiconductor substrate is comprised of a III-V compound semiconductor material or a II-VI compound semiconductor material.

5. The heterojunction bipolar transistor unit cell of claim 1, in which a power amplifier integrating the heterojunction bipolar transistor unit cell is incorporated into at least one of a music player, a video player, an entertainment unit, a navigation device, a communications device, a personal digital assistant (PDA), a fixed location data unit, a mobile phone, and a portable computer.

6. A heterojunction bipolar transistor unit cell, comprising:
    a compound semiconductor substrate;
    a first base mesa on the compound semiconductor substrate;
    a first emitter mesa on the first base mesa, a width of the first emitter mesa being greater than or equal to a length of the first emitter mesa;
    a second base mesa on the compound semiconductor substrate and spaced away from the first base mesa; and
    a second emitter mesa on the second base mesa.

7. The heterojunction bipolar transistor unit cell of claim 6, further comprising a collector contact on the compound semiconductor substrate, between the first base mesa and the second base mesa.

8. The heterojunction bipolar transistor unit cell of claim 6, further comprising an isolation layer on the compound semiconductor substrate, between the first base mesa and the second base mesa.

9. The heterojunction bipolar transistor unit cell of claim 6, in which a ratio of a first base mesa area to a first emitter mesa area is less than two.

10. The heterojunction bipolar transistor unit cell of claim 6, further comprising:
    a first base contact proximate only one side of the first emitter mesa; and
    a second base contact proximate only one side of the second emitter mesa.

11. The heterojunction bipolar transistor unit cell of claim 6, in which a power amplifier integrating the heterojunction bipolar transistor unit cell is incorporated into at least one of a music player, a video player, an entertainment unit, a navigation device, a communications device, a personal digital assistant (PDA), a fixed location data unit, a mobile phone, and a portable computer.

12. A power amplifier, comprising:
    a plurality of heterojunction bipolar transistor unit cells, each of the plurality of heterojunction bipolar transistor unit cells comprising:
        a compound semiconductor substrate;
        a base mesa on the compound semiconductor substrate; and
        a single emitter mesa on the base mesa, a width of the single emitter mesa being greater than or equal to a length of the single emitter mesa.

13. The power amplifier of claim 12, further comprising a base contact proximate only one side of the single emitter mesa.

14. The power amplifier of claim 12, incorporated into at least one of a music player, a video player, an entertainment unit, a navigation device, a communications device, a personal digital assistant (PDA), a fixed location data unit, a mobile phone, and a portable computer.

15. A method of making a heterojunction bipolar transistor unit cell, comprising:
    fabricating only a single emitter mesa; and
    fabricating a base mesa supporting the single emitter mesa, the base mesa on a compound semiconductor substrate, a width of the single emitter mesa being greater than or equal to a length of the single emitter mesa.

16. The method of claim 15, further comprising depositing a conductive contact material on the base mesa proximate only one side of the single emitter mesa.

17. The method of claim 15, further comprising:
    integrating the heterojunction bipolar transistor unit cell into a power amplifier; and incorporating the power amplifier into at least one of a music player, a video player, an entertainment unit, a navigation device, a communications device, a personal digital assistant (PDA), a fixed location data unit, a mobile phone, and a portable computer.

* * * * *